United States Patent
Peck, Jr. et al.

(10) Patent No.: US 8,013,707 B1
(45) Date of Patent: Sep. 6, 2011

(54) MAGNETIC NON-CONTACT SWITCH

(75) Inventors: James Leo Peck, Jr., Huntington Beach, CA (US); Randy Lance Brandt, Orange, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 12/895,362

(22) Filed: Sep. 30, 2010

Related U.S. Application Data

(60) Provisional application No. 61/378,724, filed on Aug. 31, 2010.

(51) Int. Cl.
*H01F 27/28* (2006.01)

(52) U.S. Cl. ...................................................... 336/170

(58) Field of Classification Search .................. 336/170, 336/180–184, 214–215, 220–223; 323/290
See application file for complete search history.

(56) References Cited

U.S. PATENT DOCUMENTS

| | | | | |
|---|---|---|---|---|
| 3,219,881 A | * | 11/1965 | Rudaz | 315/278 |
| 3,379,960 A | * | 4/1968 | May | 323/262 |
| 3,417,256 A | * | 12/1968 | Kadri | 307/43 |
| 3,621,376 A | * | 11/1971 | Friedlander et al. | 323/335 |
| 5,534,837 A | | 7/1996 | Brandt | |
| 7,378,828 B2 | | 5/2008 | Brandt | |

* cited by examiner

*Primary Examiner* — Tuyen Nguyen
(74) *Attorney, Agent, or Firm* — Yee & Associates, P.C.

(57) ABSTRACT

A switch comprising a plurality of transformers and a path comprising a number of wires. Each of the plurality of transformers comprises a core and a control winding. The path is configured to connect the plurality of transformers to each other. Non-direct current flows through the path. Direct current is sent into the control winding for each of a portion of the plurality of transformers to saturate the core for the each of the portion of the plurality of transformers such that a transfer of energy between the core for the each of the portion of the plurality of transformers and the path is substantially absent.

22 Claims, 4 Drawing Sheets

MAGNETIC NON-CONTACT SWITCH

RELATED PROVISIONAL APPLICATION

This application is related to and claims the benefit of priority of provisional U.S. Patent Application Ser. No. 61/378,724, filed Aug. 31, 2010, entitled "Magnetic Non-Contact Switch", which is incorporated herein by reference.

BACKGROUND INFORMATION

1. Field:

The present disclosure relates generally to transformers, and in particular, to transformers that are connected to each other. Still more particularly, the present disclosure relates to transformers connected to each other to form a magnetic switch.

2. Background:

Electrical power is generated, distributed, and consumed. For example, power may be generated by a dam, a gas power electric plant, a coal fired electric plant, a nuclear powered electric generation plant, a solar powered generator, a fuel cell, a dynamo, a hand powered generator, or a storage such as a battery or a flywheel.

Current switches comprise contact switches. Contact switches may be referred to as relays. In addition, active devices such as transistors, field effect transistors, and insulated-gate bi-polar transistors to control current. As used herein, active devices include p-n junction devices. Active device switches and contact switches add undesired impedance to the power circuit. Impedance means loss of power in the power circuit. Furthermore, contact switches and active device switches may add undesirable complexity to a power circuit.

Therefore, it would be advantageous to have a method and apparatus that takes into account at least some of the issues discussed above, as well as other possible issues.

SUMMARY

In one advantageous embodiment, an apparatus comprises a plurality of transformers, a path, and a number of current sources. Each of the plurality of transformers comprises a core. The path is configured to connect the plurality of transformers to each other. Non-direct current flows through the path. The number of current sources is configured to send direct current into a portion of the plurality of transformers such that a transfer of energy between the core for each of the portion of the plurality of transformers and the path is substantially absent.

In another advantageous embodiment, a switch comprises a plurality of transformers and path comprising a number of wires. Each of the plurality of transformers comprises a core and a control winding. The path is configured to connect the plurality of transformers to each other. Non-direct current flows through the path. Direct current is sent into the control winding for each of a portion of the plurality of transformers to saturate the core for the each of the portion of the plurality of transformers such that a transfer of energy between the core for the each of the portion of the plurality of transformers and the path is substantially absent.

In yet another advantageous embodiment, a method is provided for controlling a path of power in a circuit. A controller selects a portion of a plurality of transformers. The plurality of transformers are connected to each other. Each transformer in the plurality of transformers comprises a core. Direct current is sent into the portion of a plurality of transformers by a number of current sources such that a transfer of energy between the core for each of the portion of the plurality of transformers and the path is substantially absent.

The features, functions, and advantages can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the advantageous embodiments are set forth in the appended claims. The advantageous embodiments, however, as well as a preferred mode of use, further objectives, and advantages thereof, will best be understood by reference to the following detailed description of an advantageous embodiment of the present disclosure when read in conjunction with the accompanying drawings, wherein:

DETAILED DESCRIPTION

The different advantageous embodiments recognize and take into account a number of different considerations. For example, the different advantageous embodiments recognize and take into account that currently available contact switches have undesired losses in power. The different advantageous embodiments recognize and take into account that having a switch comprised of transformers in may provide a switching mechanism when different transformers are saturated. Further, the different advantageous recognize and take into account that switches comprising transformers may reduce undesired losses in power and reduce the complexity of switches.

Thus, the different advantageous embodiments provide a method and apparatus for controlling a path of power in a circuit. In one advantageous embodiment, an apparatus comprises a plurality of transformers, a path, and a number of current sources. Each of the plurality of transformers comprises a core. The path is configured to connect the plurality of transformers to each other. Non-direct current flows through the path. The number of current sources is configured to send direct current into a portion of the plurality of transformers such that a transfer of energy between the core for each of the portion of the plurality of transformers and the path is substantially absent.

Figure 1:
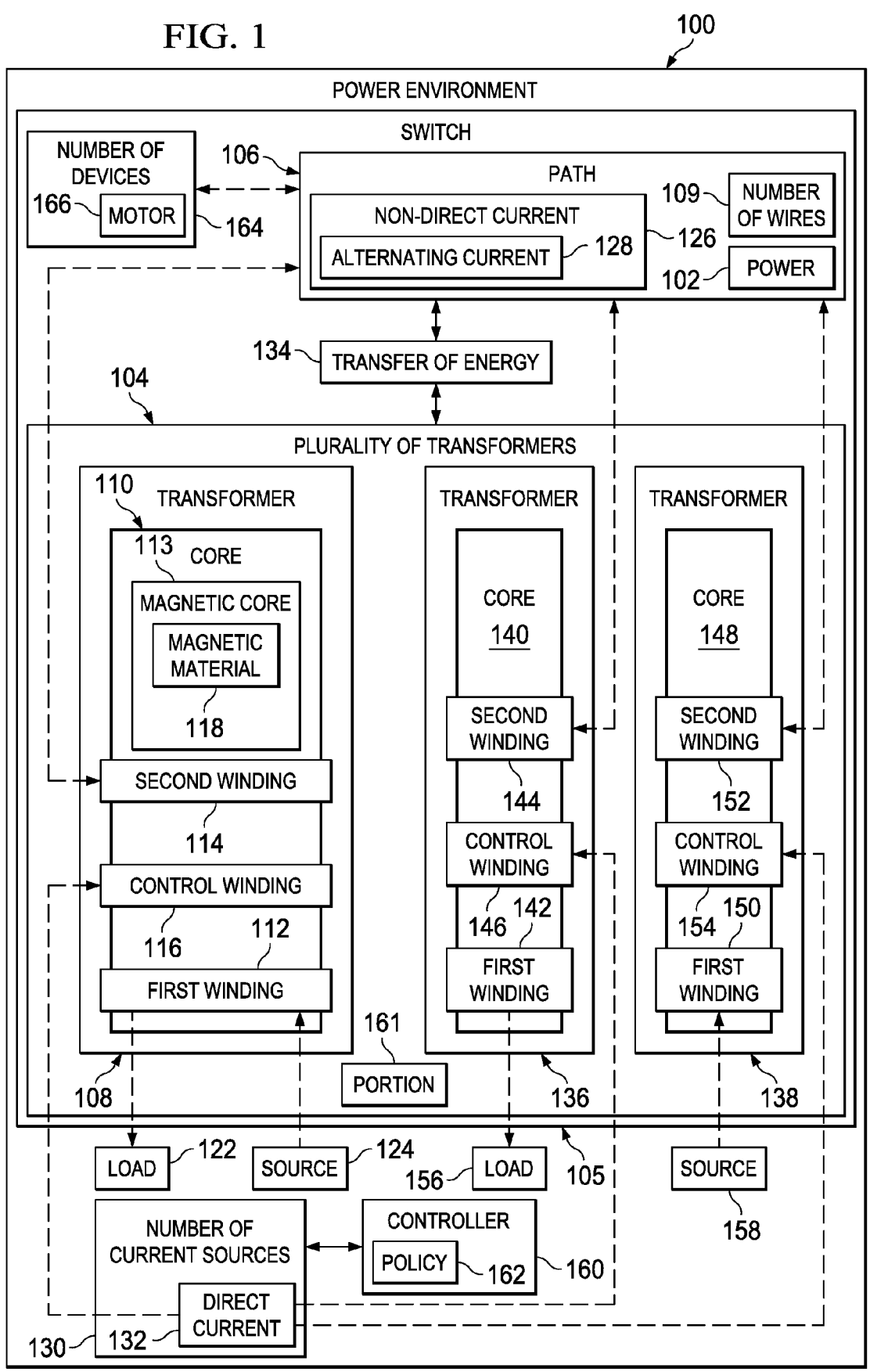
FIG. 1 is an illustration of a power environment in which an advantageous embodiment may be implemented.

Turning first to FIG. 1, an illustration of a power environment is depicted in accordance with an advantageous embodiment. In this illustrative example, power environment 100 is an example of an environment in which power 102 is distributed. As depicted, power environment 100 includes plurality of transformers 104 and path 106. Plurality of transformers 104 and path 106 form switch 105.

In this illustrative example, transformer 108 is one example of a transformer in plurality of transformers 104. Transformer 108 comprises core 110, first winding 112, second winding 114, and control winding 116. Core 110 is magnetic core 113 in these depicted examples. Magnetic core 113 is comprised of magnetic material 118. Magnetic material 118 may be any material having magnetic properties. Magnetic material 118 may take the form of, for example, without limitation, a ferromagnetic metal, iron, silicon steel, carbonyl iron, compressed powdered iron, ferrites, an amorphous metal, a combination of these materials, and/or other suitable types of materials. When all cores for all transformers in plurality of transformers are magnetic cores, plurality of transformers is a magnetic non-contact switch.

In these depicted examples, first winding 112, second winding 114, and control winding 116 may be referred to as coils. First winding 112, second winding 114, and control winding 116 wind around core 110, with each coil having a selected number of turns. First winding 112, second winding 114, and control winding 116 are comprised of conductive material.

As illustrated, first winding 112 may be connected to one of load 122 and source 124 in these illustrative examples. As used herein, when a first component, such as first winding 112, is connected to a second component, such as load 122, the first component may be connected to the second component without any additional components. The first component also may be connected to the second component by one or more other components.

For example, one electronic device may be connected to a second electronic device without any additional electronic devices between the first electronic device and the second electronic device. In some cases, another electronic device may be present between the two electronic devices connected to each other. In some illustrative examples, first winding 112 may be connected to load 122.

In these illustrative examples, load 122 may be any electronic circuit configured to consume power 102. The circuit may be part of an electronic device. The electronic device may be, for example, without limitation, an appliance in a household, such as a lamp, a microwave, a toaster, a television set, a vacuum cleaner. Load 122 may be a combination of the electronic devices.

Source 124 may be any source configured to generate power 102. In particular, source 124 may be any source configured to generate non-direct current 126. In these illustrative examples, non-direct current 126 takes the form of alternating current 128. In these depicted examples, source 124 may be any electrical source such as, for example, without limitation, a chemical battery, an electronic power supply, a mechanical generator, and/or any other source of continuous electrical energy in the form of non-direct current 126.

In these illustrative examples, second winding 114 for transformer 108 is connected to path 106. Further, each second winding in each transformer in plurality of transformers 104 is connected to path 106. In this manner, path 106 connects all of plurality of transformers 104 to each other.

As depicted, path 106 is comprised of number of wires 109. Number of wires 109 is comprised of conductive material in these examples. As illustrated, non-direct current 126 flows through number of wires 108 for path 106.

Transformer 108 is configured such that energy is transferred from a source, such as source 124, through transformer 108 to a load, such as load 122. In these illustrative examples, path 106 may be either a load or source for transformer 108. For example, when first winding 112 is connected to load 122, path 106 acts as a source. When first winding 112 is connected to source 124, path 106 acts as a load.

In this manner, transformer 108 is configured such that energy from non-direct current 126 is transferred between first winding 112 and second winding 114. For example, energy may be transferred from first winding 112 through core 110 to second winding 114. Similarly, energy may be transferred from second winding 114 through core 110 to first winding 112. As illustrated, control winding 116 for transformer 108 is connected to number of current sources 130.

Number of current sources 130 is configured to generate direct current 132. Further, number of current sources 130 is configured to send direct current 132 into control winding 116. Direct current 132 traveling through control winding 116 saturates core 110 such that transfer of energy 134 through core 110 is reduced.

Core 110 reaches saturation when an increase in the applied external magnetizing field H cannot increase the magnetization of the material further, so the total magnetic field B levels off. Saturation occurs when the magnetic flux through core 110 reaches a maximum value. In particular, direct current 132 saturates core 110 such that transfer of energy 134 between first winding 112 and second winding 114 through core 110 is substantially absent.

In this manner, transfer of energy 134 between first winding 112 and second winding 114 is reduced to substantially zero when direct current 132 is sent into control winding 116. The amount of direct current 132 required to saturate core 110 may be small as compared to the amount of non-direct current 126 flowing through path 106.

In these illustrative examples, transformer 108 is connected to other transformers in plurality of transformers 104. For example, transformer 108 is connected to transformer 136 and transformer 138 in this illustrative example. Transformer 136 and transformer 138 are configured in a manner similar to transformer 108.

For example, transformer 136 has core 140, first winding 142, second winding 144, and control winding 146. Transformer 138 has core 148, first winding 150, second winding 152, and control winding 154.

As one illustrative example, first winding 112 for transformer 108 is connected to load 122. First winding 142 for transformer 136 is connected to load 156. First winding 150 for transformer 138 is connected to source 158. Second winding 144 for transformer 136 and second winding 152 for transformer 138 are connected to path 106. Control winding 146 for transformer 136 and control winding 154 for transformer 138 are connected to number of current sources 130.

In this manner, path 106 through second winding 114, second winding 144, and second winding 152 forms a circuit through which, in this example, alternating current 128 flows. In other words, power 102 generated by source 158 is sent to load 122 and load 156 using path 106 in this illustrative example.

Additionally, in this illustrative example, the path of power 102 from source 158 to load 122 and load 156 may be controlled using controller 160. Controller 160 may be a computer system comprising a number of computers or a processor unit in these illustrative examples. Controller 160 is configured to control to which of control winding 116, control winding 146, and control winding 154, direct current 132 is sent.

For example, controller 160 may send a command to number of current sources 130 to send direct current 132 to control winding 116. Direct current 132 traveling in control winding 116 saturates core 110 in transformer 108. As a result, transfer of energy 134 between core 110 and path 106 is substantially absent. In other words, as alternating current 128 flows through path 106, transfer of energy 134 from second winding 114 to first winding 112 is substantially absent. In this manner, power 102 is delivered from source 158 to load 156 without reaching load 122.

Similarly, controller 160 may send a command to number of current sources 130 to send direct current 132 to control winding 146. Direct current 132 traveling through control winding 146 saturates core 140 for transformer 136. In this manner, transfer of energy 134 through transformer 136 is substantially absent. Power 102 is delivered from source 158 to load 122 without reaching load 156.

In this manner, plurality of transformers 104 and path 106 form switch 105. Switch 105 allows the delivery of power 102 through path 106 to be changed.

In other illustrative examples, plurality of transformers 104 may include more than three transformers. Controller 160 is configured to select portion 161 of plurality of transformers 104 to which to send direct current 132. This selection may be made using, for example, policy 162. Policy 162 may be a number of rules and/or criteria for selecting which transformers in plurality of transformers 104 to which to send direct current 132.

For example, policy 162 may indicate that direct current 132 is to be sent to control winding 116 in response to an event, such as a periodic event or a non-periodic event. As one example, direct current 132 may be sent to control winding 116 every other hour. Further, policy 162 may indicate that direct current 132 is to be sent to control winding 146 every hour in between. In other words, switch 105 is used to alternate the delivery of power 102 from source 158 between load 122 and load 156 every hour.

Additionally, in other illustrative examples, path 106 may connect plurality of transformers 104 and number of devices 164 to each other. Number of devices 164 may include, for example, motor 166. Motor 166 is a stator in these examples.

The illustration of power environment 100 in FIG. 1 is not meant to imply physical or architectural limitations to the manner in which different advantageous embodiments may be implemented. Other components in addition to and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

For example, in some illustrative embodiments, plurality of transformers 104 may include other transformers in addition to the ones depicted. Further, devices in addition to motor 166 may be connected to path 106. In other illustrative examples, plurality of transformers 104 may include sets of transformers connected to path 106. As one illustrative example, each set of transformers may include three transformers configured to operate in three phases. Direct current 132 may be used to switch between phases for these sets of transformers. Further, in the different illustrative embodiments, controller 160 may take some other form implemented using some combination of hardware and/or software.

Figure 2:
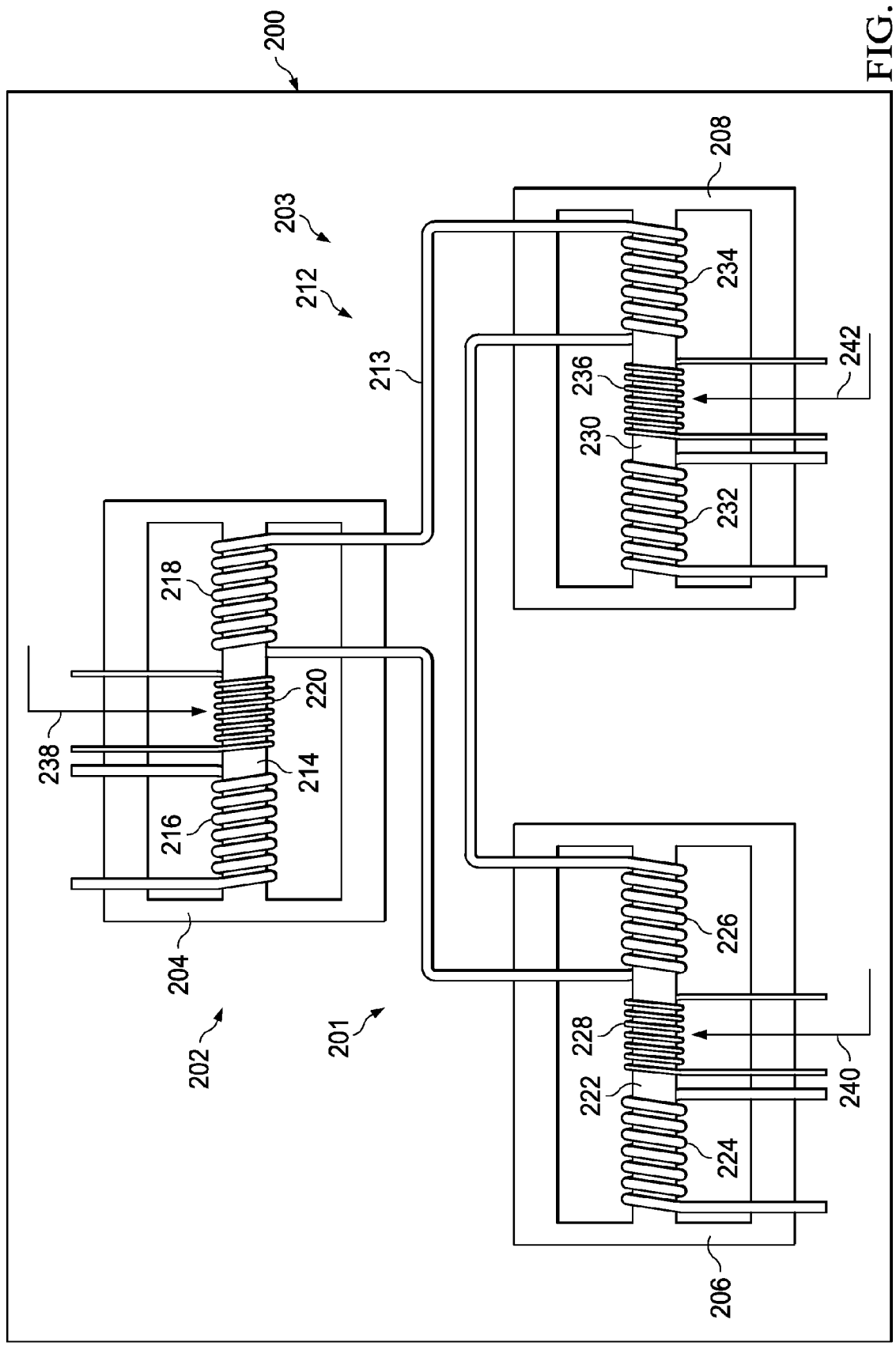
FIG. 2 is an illustration of a portion of a power environment depicted in accordance with an advantageous embodiment.

With reference now to FIG. 2, an illustration of a portion of a power environment is depicted in accordance with an advantageous embodiment. Power environment 200 is an example of one implementation for power environment 100 in FIG. 1. As depicted, power environment 200 includes switch 201. Switch 201 includes plurality of transformers 202 and path 203.

As depicted, plurality of transformers 202 includes transformer 204, transformer 206, and transformer 208. Transformer 204 includes core 214, first winding 216, second winding 218, and control winding 220. Transformer 206 includes core 222, first winding 224, second winding 226, and control winding 228. Transformer 208 includes core 230, first winding 232, second winding 234, and control winding 236.

In this illustrative example, path 212 connects transformer 204, transformer 206, and transformer 208 to each other using number of wires 213. In particular, number of wires 213 connects the transformers through second winding 218, second winding 226, and second winding 234.

As illustrated, a number of current sources, such as, for example, without limitation, number of current sources 130 in FIG. 1, may be configured to send direct current into a portion of plurality of transformers 202. In particular, direct current 238 may be sent into control winding 220 for transformer 204. Direct current 240 may be sent into control winding 228 for transformer 206. Direct current 242 may be sent into control winding 236 for transformer 208.

When direct current is sent into a control winding for a transformer, the core for that transformer is saturated such that a transfer of energy between path 203 and the core is substantially absent. A controller, such as controller 160 in FIG. 1, may select a portion of plurality of transformers 202 to which to send power. For example, first winding 216 for transformer 204 is connected to a source. First winding 224 for transformer 206 is connected to a load. First winding 232 for transformer 208 is connected to a load.

The source connected to first winding 216 for transformer 206 generates alternating current that is sent into path 203 in this illustrative example. This alternating current flows through path 203 and is capable of being transferred out of path 203 through transformer 206 and transformer 208. In other words, the power generated by the source connected to transformer 206 is delivered to the loads connected to first winding 224 for transformer 206 and first winding 232 for transformer 208 through path 203.

In this illustrative example, direct current 240 may be sent into control winding 228 to saturate core 222. As a result, power may be delivered to a load connected to transformer 208 without being delivered to the load connected to transformer 206. Similarly, direct current 242 may be sent into control winding 236 to saturate core 230. As a result, power may be delivered to the load connected to transformer 206 without being delivered to the load connected to transformer 208. In this manner, the delivery of power through transformer 206 and the delivery of power through transformer 208 may be alternated.

Of course, in other illustrative embodiments, other configurations for switch 201 may be present. For example, in some illustrative examples, both transformer 206 and transformer 204 may be connected to sources, with transformer 208 being connected to a load. Switch 201 may be used to alternate the delivery of power to the load between the two sources.

Figure 3:
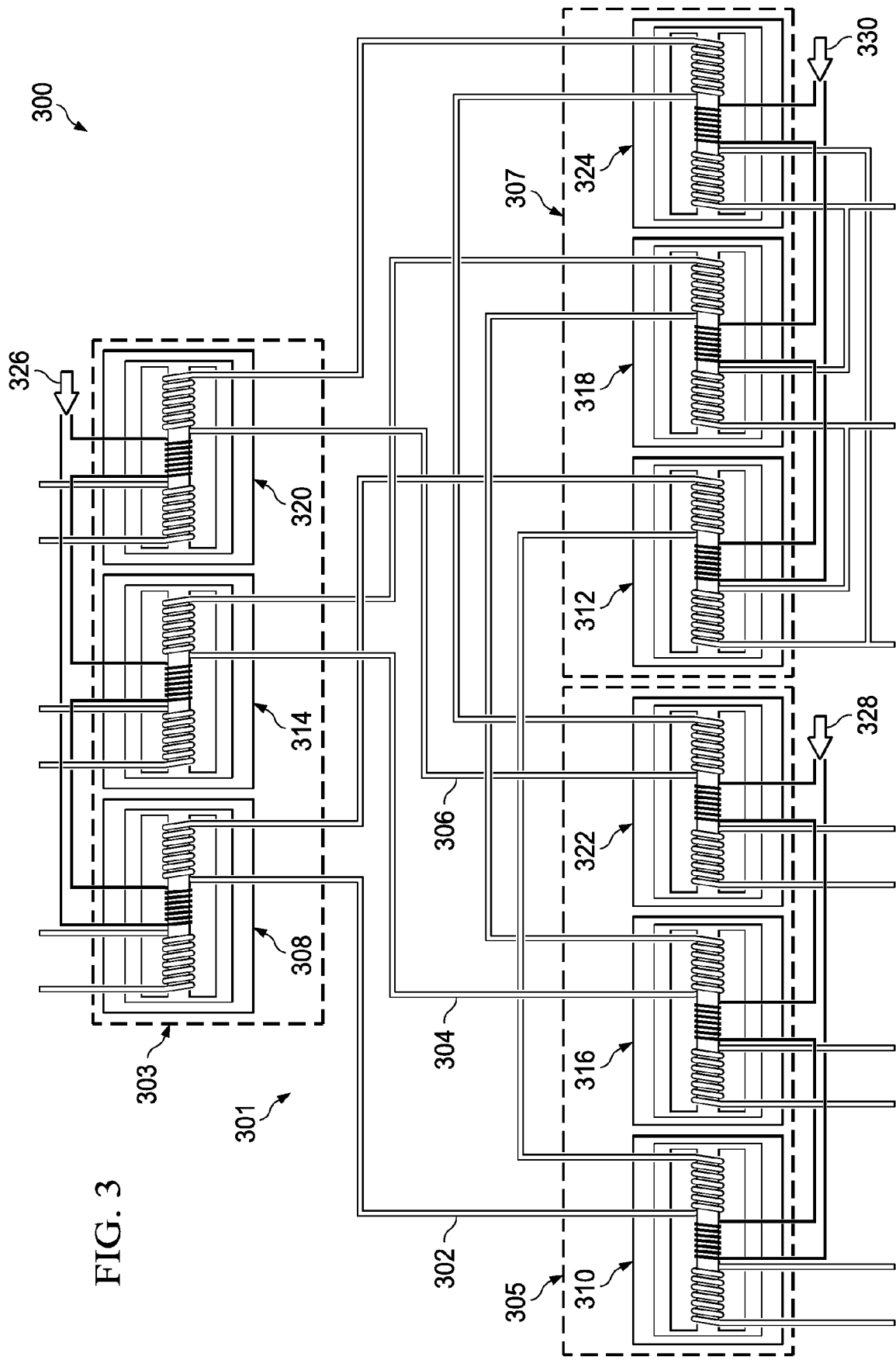
FIG. 3 is an illustration of a portion of a power environment depicted in accordance with an advantageous embodiment.

With reference now to FIG. 3, an illustration of a portion of a power environment is depicted in accordance with an advantageous embodiment. In this illustrative example, power environment 300 is an example of one implementation for power environment 100 in FIG. 1. As depicted, power environment 300 includes switch 301.

In this illustrative example, switch 301 includes path 302, path 304, and path 306. Further, switch 301 includes set of transformers 303, set of transformers 305, and set of transformers 307. Each set of transformers is configured to have three phases of operation. In other words, each set of transformers forms a 3-phase transformer. Each path connects a transformer for a particular phase in each of the set of transformers to the corresponding transformers in the other sets of transformers.

For example, path 302 connects transformers 308, 310, and 312. Path 304 connects transformer 314, 316, and 318. Path 306 connects transformer 320, 322, and 324. Each of these transformers has a first winding, a second winding, a control winding, and a core.

Direct current 326 may be sent into set of transformers 303. Direct current 328 may be sent into set of transformers 305. Direct current 330 may be sent into set of transformers 307. A controller, such as controller 160 in FIG. 1, may be configured to control which set of transformers receives direct current.

Figure 4:
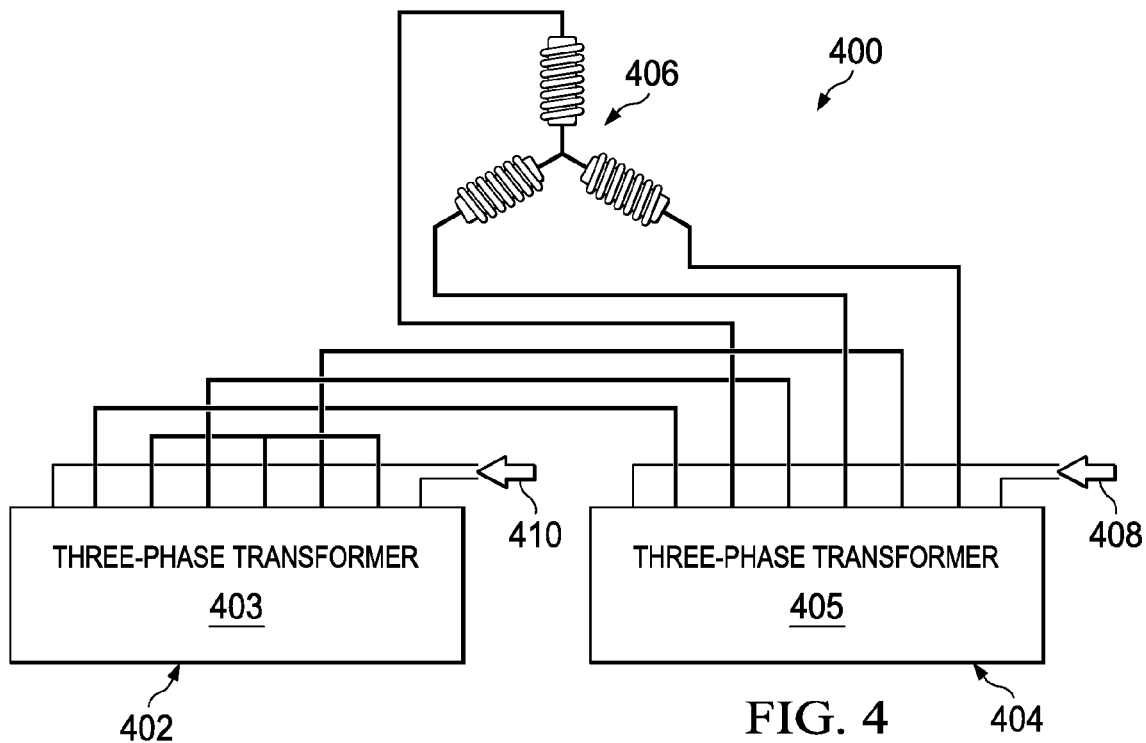
FIG. 4 is an illustration of a switch for a flywheel drive depicted in accordance with an advantageous embodiment.

With reference now to FIG. 4, an illustration of a switch for a flywheel drive is depicted in accordance with an advantageous embodiment. In this illustrative example, switch 400 is an example of one implementation for switch 105 in FIG. 1.

As depicted, switch 105 includes transformer 402, transformer 404, and flywheel drive 406. Flywheel drive 406 is an example of one implementation for motor 166 in FIG. 1. Transformer 402 and transformer 404 are three-phase transformer 403 and three-phase transformer 405, respectively.

In this illustrative example, power generated by a source connected to transformer 402 is transferred through transformer 402 to flywheel drive 406. This power is used to spin flywheel drive 406. When energy is transferred to flywheel drive 406 through transformer 402, direct current 408 is sent into transformer 404 such that a transfer of energy through transformer 404 is substantially absent. In this manner, all of the energy transferred to flywheel drive 406 through transformer 402 is stored in flywheel drive 406.

Removing direct current 408 sent into transformer 404 and sending direct current 410 into transformer 402 causes the energy stored in flywheel drive 406 to be transferred to a load connected to transformer 404. In this manner, a transfer of energy is present between flywheel drive 406 and transformer 404.

Figure 5:
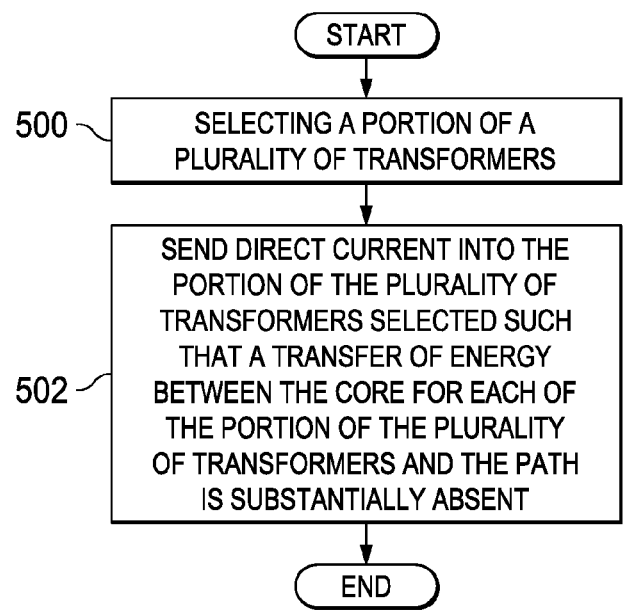
FIG. 5 is a flowchart of a process for controlling a path of power in a circuit depicted in accordance with an advantageous embodiment.

With reference now to FIG. 5, an illustration of a flowchart of a process for controlling a path of power in a circuit is depicted in accordance with an advantageous embodiment. The process illustrated in FIG. 5 may be implemented in power environment 100 in FIG. 1. This process may be implemented using, for example, switch 105 in FIG. 1.

The process begins by a controller selecting a portion of a plurality of transformers (operation 500). The plurality of transformers are connected to each other in a circuit. The circuit is formed by a number of wires connecting the plurality of transformers. In particular, the number of wires is connected to windings in each of the plurality of transformers. Each transformer in the plurality of transformers has a core.

Thereafter, a number of current sources sends direct current into the portion of the plurality of transformers selected such that a transfer of energy between the core for the each of the portion of the plurality of transformers and the path is substantially absent (operation 502), with the process terminating thereafter.

The flowchart and block diagrams in the different depicted embodiments illustrate the architecture, functionality, and operation of some possible implementations of apparatus and methods in different illustrative embodiments. In this regard, each block in the flowchart or block diagrams may represent a module, segment, function, and/or a portion of an operation or step. In some alternative implementations, the function or functions noted in the block may occur out of the order noted in the figures. For example, in some cases, two blocks shown in succession may be executed substantially concurrently, or the blocks may sometimes be executed in the reverse order, depending upon the functionality involved. Also, other blocks may be added in addition to the illustrated blocks in a flowchart or block diagram.

Thus, the different advantageous embodiments provide a method and apparatus for controlling a path of power in a circuit. In one advantageous embodiment, an apparatus comprises a plurality of transformers, a path, and a number of current sources. Each of the plurality of transformers comprises a core. The path is configured to connect the plurality of transformers to each other. Non-direct current flows through the path. The number of current sources is configured to send direct current into a portion of the plurality of transformers such that a transfer of energy between the core for each of the portion of the plurality of transformers and the path is substantially absent.

The description of the different advantageous embodiments has been presented for purposes of illustration and description and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. An apparatus comprising:
   a plurality of transformers, wherein each of the plurality of transformers comprises a core;
   a path configured to connect the plurality of transformers to each other, wherein non-direct current flows through the path; and
   a number of current sources configured to send direct current into a portion of the plurality of transformers such that a transfer of energy between the core for each of the portion of the plurality of transformers and the path is substantially absent.

2. The apparatus of claim 1, wherein each of the plurality of transformers is connected to at least one of a load and a source.

3. The apparatus of claim 1, wherein the each of the plurality of transformers further comprises:
   a first winding connected to one of a load and a source;
   a second winding connected to the path; and
   a control winding.

4. The apparatus of claim 3, wherein the number of current sources is configured to send the direct current into the control winding for the each of the portion of the plurality of transformers to saturate the core for the each of the portion of the plurality of transformers.

5. The apparatus of claim 1, wherein the path comprises a plurality of wires.

6. The apparatus of claim 1, wherein the non-direct current flowing in the path passes through the portion of the plurality of transformers without the transfer of energy from the core for the each of the portion of the plurality of transformers to the path.

7. The apparatus of claim 1, wherein the non-direct current flowing in the path passes through the portion of the plurality of transformers without the transfer of energy from the path to the core for the each of the portion of the plurality of transformers.

8. The apparatus of claim 1, wherein the non-direct current is alternating current.

9. The apparatus of claim 1 further comprising:
a controller configured to select the portion of plurality of transformers to which the number of current sources sends the direct current.

10. The apparatus of claim 9, wherein the controller is further configured to select the portion of the plurality of transformers using a policy.

11. The apparatus of claim 1, wherein the plurality of transformers are connected to each other to form a switch.

12. The apparatus of claim 11, wherein the switch is a magnetic non-contact switch.

13. The apparatus of claim 1, wherein the path is further configured to connect the plurality of transformers and a number of devices to each other.

14. The apparatus of claim 13, wherein a device in the number of devices is a motor.

15. A switch comprising:
a plurality of transformers, wherein each of the plurality of transformers comprises a core and a control winding; and
a path comprising a number of wires and configured to connect the plurality of transformers to each other, wherein non-direct current flows through the path, and wherein direct current is sent into the control winding for each of a portion of the plurality of transformers to saturate the core for the each of the portion of the plurality of transformers such that a transfer of energy between the core for the each of the portion of the plurality of transformers and the path is substantially absent.

16. The switch of claim 14, wherein the direct current is received from a plurality of current sources.

17. The switch of claim 15, wherein the each of the plurality of transformers further comprises:
a first winding connected to one of a load and a source; and
a second winding connected to the path.

18. The apparatus of claim 15, wherein the non-direct current flowing in the path passes through the portion of the plurality of transformers without the transfer of energy from the core for the each of the portion of the plurality of transformers to the path.

19. The apparatus of claim 15, wherein the non-direct current flowing in the path passes through the portion of the plurality of transformers without the transfer of energy from the path to the core for the each of the portion of the plurality of transformers.

20. A method for controlling a path of power in a circuit, the method comprising:
selecting, by a controller, a portion of a plurality of transformers, wherein the plurality of transformers are connected to each other in the circuit and each transformer in the plurality of transformers comprises a core; and
sending, by a number of current sources, direct current into the portion of the plurality of transformers such that a transfer of energy between the core for the each of the portion of the plurality of transformers and the path is substantially absent.

21. The method of claim 20, wherein the transformer in the plurality of transformers further comprises a plurality of windings, wherein the step of sending direct current into the portion of the plurality of transformers such that the transfer of energy through the portion of the plurality of the plurality of transformers is substantially absent comprises:
sending, by the number of current sources, the direct current into a control winding around a core for each of the portion of the plurality of transformers to saturate the core for the each of the portion of the plurality of transformers.

22. The method of claim 20, wherein the step of selecting, by the controller, the portion of the plurality of transformers using a controller, wherein the plurality of transformers are connected to each other comprises:
selecting, by the controller, the portion of the plurality of transformers using a controller using a policy, wherein the plurality of transformers are connected to each other.

* * * * *